(12) United States Patent
Jung et al.

(10) Patent No.: US 9,153,475 B2
(45) Date of Patent: Oct. 6, 2015

(54) SEMICONDUCTOR DEVICE AND METHOD OF MANUFACTURING THE SAME

(75) Inventors: Woo Duck Jung, Gyeonggi-do (KR); Sung Soon Kim, Seoul (KR); Ju Il Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 378 days.

(21) Appl. No.: 13/599,775

(22) Filed: Aug. 30, 2012

(65) Prior Publication Data

US 2013/0277730 A1 Oct. 24, 2013

(30) Foreign Application Priority Data

Apr. 20, 2012 (KR) .......................... 10-2012-0041518

(51) Int. Cl.
*H01L 21/764* (2006.01)
*H01L 27/115* (2006.01)

(52) U.S. Cl.
CPC ........ *H01L 21/764* (2013.01); *H01L 27/11534* (2013.01)

(58) Field of Classification Search
CPC ............ H01L 21/764; H01L 27/11534; H01L 21/486; H01L 21/7684; H01L 21/76838; H01L 21/76264; H01L 21/76289; H01L 21/7682; H01L 29/0649; H01L 29/4991; H01L 2221/1042; H01L 2221/1047; H01L 2924/1438
USPC .......................................................... 257/522
See application file for complete search history.

(56) References Cited

U.S. PATENT DOCUMENTS

| | | | |
|---|---|---|---|
| 2012/0132985 A1* | 5/2012 | Kai et al. ....................... | 257/326 |
| 2012/0178235 A1* | 7/2012 | Pachamuthu et al. ......... | 438/421 |
| 2013/0307044 A1* | 11/2013 | Kinoshita et al. ............. | 257/314 |

* cited by examiner

*Primary Examiner* — Jose R Diaz
(74) *Attorney, Agent, or Firm* — IP & T Group LLP (57) ABSTRACT

A semiconductor device includes a semiconductor substrate having a plurality of isolation regions, a plurality of trenches, where each of the plurality of trenches is formed in a corresponding isolation region, of the plurality of isolation regions, and where the plurality of trenches are arranged, in parallel, along a first direction, a plurality of gate lines formed on the semiconductor substrate in a second direction crossing the plurality of trenches, an insulating layer formed between each of the plurality of gate lines, a first air gap formed in at least one of the plurality of trenches, the first air gap extending in the first direction, and a second air gap formed in at least one of the insulating layers, the second air gap extending in the second direction.

10 Claims, 11 Drawing Sheets

SEMICONDUCTOR DEVICE AND METHOD OF MANUFACTURING THE SAME

CROSS-REFERENCE TO RELATED APPLICATION

Priority is claimed to Korean patent application number 10-2012-0041518, filed on Apr. 20, 2012, the entire disclosure of which is incorporated herein by reference in its entirety.

BACKGROUND

1. Field of Invention

Embodiments of the present invention relate to a semiconductor device and a method of manufacturing the same and, more particularly, to a semiconductor device including an isolation region and a method of manufacturing the same.

2. Description of Related Art

With increasing integration degree of devices, device size and spacing between devices become smaller, which may result in operating errors or deterioration of electrical characteristics due to interference between the devices.

BRIEF SUMMARY

An embodiment relates to a semiconductor device that can improve electrical characteristics and reliability of a device and a method of manufacturing the same.

A semiconductor device according to an exemplary embodiment of the present invention includes a semiconductor substrate having a plurality of isolation regions, a plurality of trenches, where each of the plurality of trenches is formed in a corresponding isolation region, of the plurality of isolation regions, and where the plurality of trenches are arranged, in parallel, along a first direction, a plurality of gate lines formed on the semiconductor substrate in a second direction crossing the plurality of trenches, an insulating layer formed between each of the plurality of gate lines, a first air gap formed in at least one of the plurality of trenches, the first air gap extending in the first direction, and a second air gap formed in at least one of the insulating layers, the second air gap extending in the second direction.

A method of manufacturing a semiconductor device according to an exemplary embodiment of the present invention includes forming, in a first direction, trenches in isolation regions of a semiconductor substrate, forming an isolation layer in each of the of trenches, forming gate lines, in a second direction crossing the first direction, over the isolation layers and over active regions defined between the isolation layers, forming first air gaps, extending in the first direction, by performing an etching process to remove at least a portion of each of the isolation layers, and forming an insulating layer between the gate lines so that an air gap is formed in the insulating layer, wherein the air gap extends in the first direction in the trenches and extends in the second direction between the gate lines.

A semiconductor device according to another exemplary embodiment of the present invention includes a semiconductor substrate having trenches defined, in a first direction, by corresponding isolation regions, a plurality of gate lines formed on the semiconductor substrate, the gate lines being defined, in a second direction crossing the plurality of trenches, by an insulating layer, first air gaps formed in, and defined by, each of the trenches, and second air gaps formed in, and defined by, the insulating layer.

DESCRIPTION OF EMBODIMENTS

Hereinafter, various exemplary embodiments of the present disclosure will be described in detail with reference to the accompanying drawings. The figures are provided to enable those of ordinary skill in the art to make and use the present invention according to the embodiments of the present invention.

Figure 1:
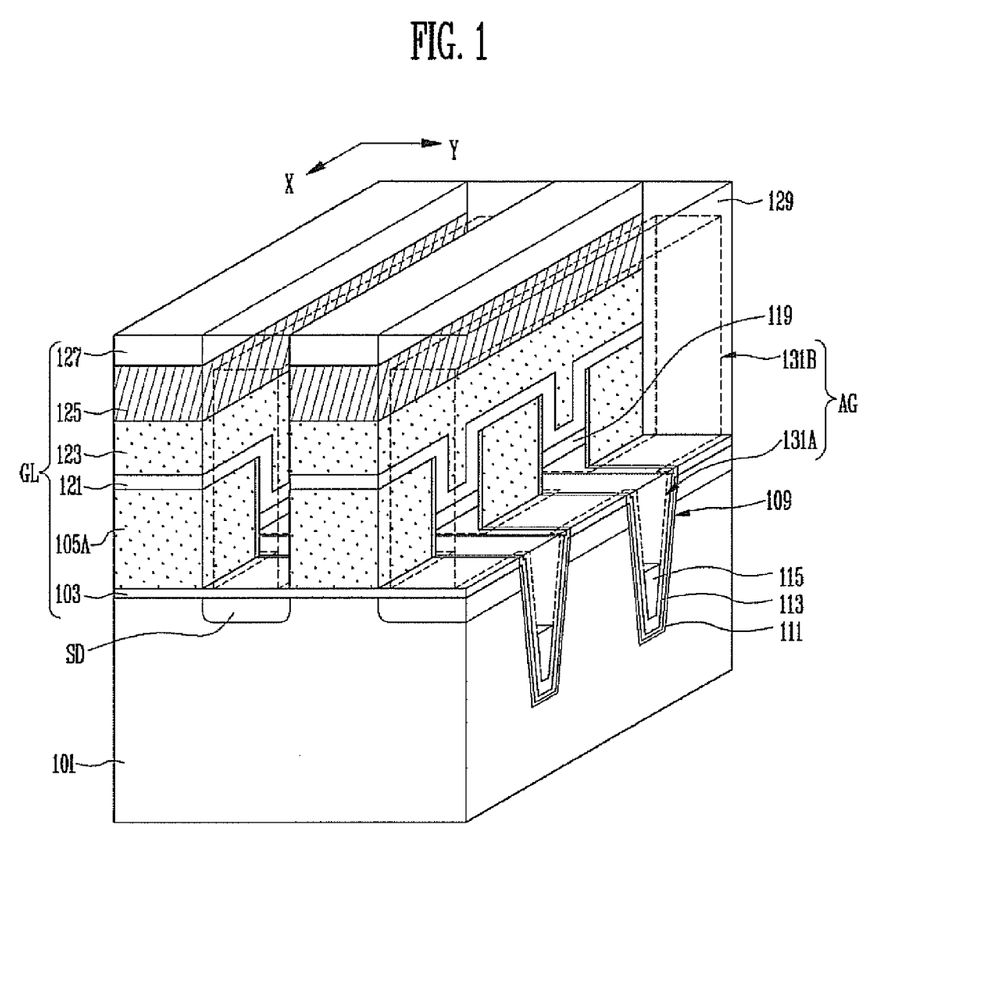
FIG. 1 is a three-dimensional view of a semiconductor device according to an embodiment of the present invention.

FIG. 1 is a three-dimensional view of a semiconductor device according to an embodiment of the present invention.

Referring to FIG. 1, a plurality of trenches 109 may be formed in isolation regions of a semiconductor substrate 101 in a first direction Y. Active regions may be defined between the isolation regions. In addition, gate lines GL may be arranged in a second direction X crossing the trenches 109. More specifically, the gate lines GL may be formed over the semiconductor substrate 101 in the second direction X such that the gate lines GL may cross the active regions and the isolation regions of the semiconductor substrate 101. Source/drains SD may be formed in the active regions of the semiconductor substrate 101 between the gate lines GL.

As for a NAND flash memory device, each of the gate lines GL may include a tunnel insulating layer 103, floating gates 105A, a dielectric layer 121 and a control gate 123 and 125. The floating gates 105A may be located only in the active regions. The control gate may include a doped polysilicon layer 123 and a metallic conductive layer 125 that are stacked.

Air gaps AG may extend in the first direction Y in the trenches 109 and in the second direction X in insulating layers 129.

A wall oxide layer 111 may be formed along a sidewall and a bottom surface of each of the trenches 109, and a sealing insulating layer 113 may further be formed over a surface of the wall oxide layer 111.

A capping insulating layer 119 may be formed along a bottom portion of the gate line GL (especially, a bottom surface of the dielectric layer) in the isolation region in which the trench 109 is formed. The capping insulating layer 119 may be a portion of the isolation layer that remains at the bottom surface of the gate line GL when the isolation layer formed in the trench 109 is removed.

A lower insulating layer 115 may be formed in a lower portion of each of the trenches 109. The lower insulating layer 115 may be formed to control the height or position of the air gap AG. Therefore, the air gap AG may be formed on the lower insulating layer 115.

Each of the air gaps AG may include first air gaps 131A that extend in the first direction Y in the trenches 109 and second air gaps 131B that extend in the second direction X in the insulating layer 129 formed between the gate lines GL. The first air gaps 131A and the second air gaps 131B may communicate with each other.

The insulating layer 129 may be deposited more thickly on a top portion of the gate line GL (especially, top corners) than on a sidewall thereof. In other words, the insulating layer 129 may comprise a plasma-enhanced undoped silicon glass (PE-USG) layer having poor step coverage.

When the isolation layer is removed from the trench 109, the first air gap 131A may be formed in a region from which the isolation layer is removed. When the semiconductor substrate 101 is divided into a cell region and a peripheral region, the first air gap 131A may be formed only in the cell region. In comparison, isolation layers may remain in isolation regions in the peripheral region.

The isolation layer may comprise a spin-on-glass (SOG) layer or a perhydro-polysilazane (PSZ) layer. The isolation layer may comprise a nitride layer, a polysilicon layer, a tungsten layer, or a titanium nitride (TiN) layer.

When the air gaps 131B are formed between the gate lines GL and extend in a gate line direction (X), parasitic capacitance between the gate lines GL may be reduced to prevent interference. In addition, when the air gaps 131A that extend in a trench direction (Y) are formed in the trenches 109, parasitic capacitance between the source/drains SD may be reduced to prevent interference. In other words, interference may be suppressed by reducing parasitic capacitance between junction regions (SD) of different memory strings. In particular, when the air gaps 131A and 131B are coupled to each other, parasitic capacitance between the junction region (SD), under the floating gate 105A, and another floating gate, of a different memory string adjacent to a memory string including the floating gate 105A, may also be reduced to suppress interference.

In addition, portions of the air gaps 131A may also be located between the floating gates, included in different memory strings, to reduce parasitic capacitance between the floating gates 105A and suppress interference.

A method of manufacturing a semiconductor device including the above-described structures will be described below.

FIGS. 2A to 2H are views illustrating a method of manufacturing a semiconductor device according to an embodiment of the present invention.

Figure 2A:
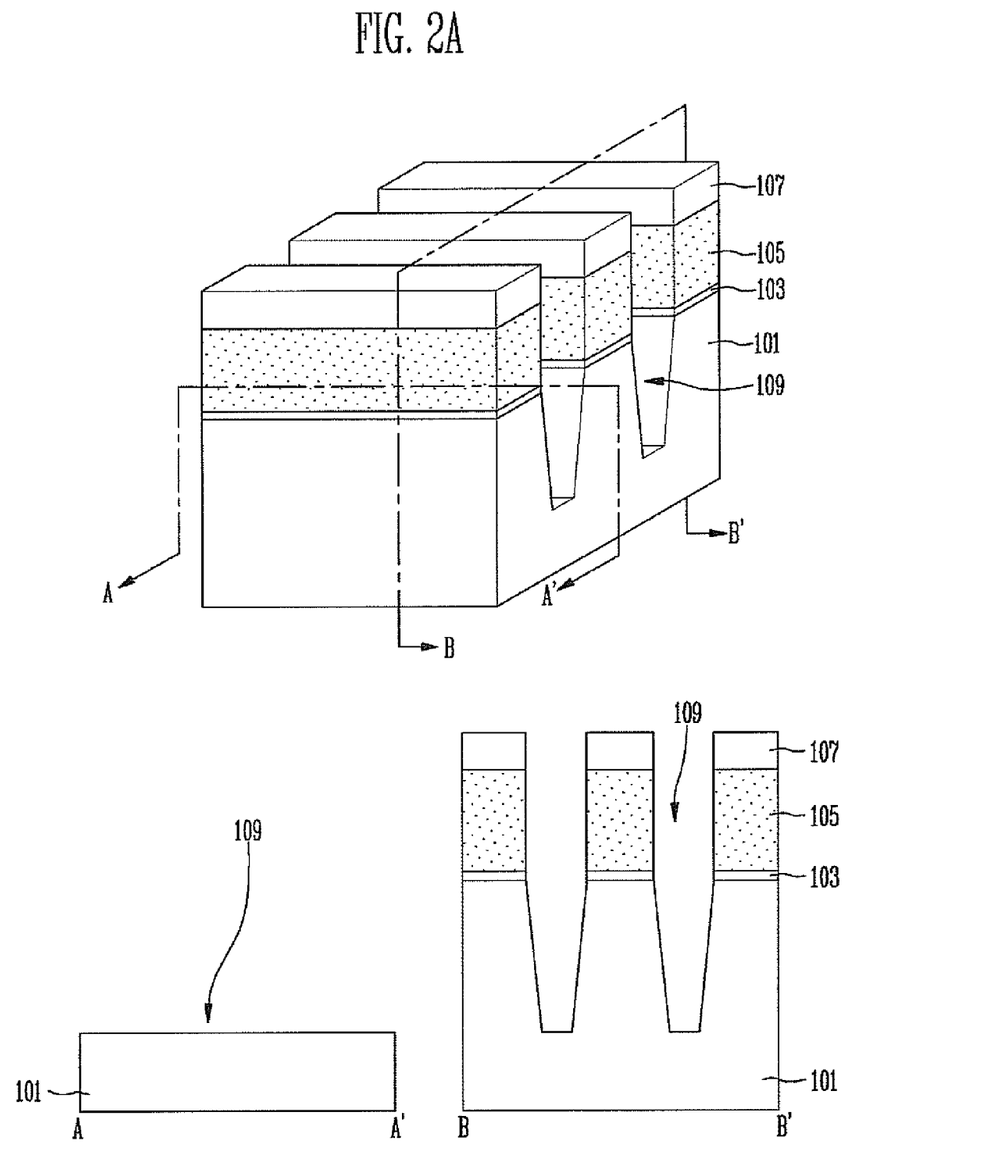
FIGS. 2A to 2H are views illustrating a method of manufacturing a semiconductor device according to an embodiment of the present invention.

Referring to FIG. 2A, isolation layers in the trenches 109 may be formed, in a first direction, in isolation regions defined in the semiconductor substrate 101. Gate lines GL may be formed over the isolation layers and over active regions defined between the isolation layers in a second direction crossing the first direction. Hereinafter, processes of forming isolation layers and gate lines in a NAND flash device will be exemplified.

First, the tunnel insulating layer 103, a first silicon layer 105 to form floating gates, and a hard mask layer 107 may be formed over the semiconductor substrate 101. Subsequently, after the hard mask layer 107, the first silicon layer 105, and the tunnel insulating layer 103 over the isolation regions are etched, exposed regions (isolation regions) of the semiconductor substrate 101 may be etched to form the trenches 109. The trenches 109 may be arranged in parallel along the first direction Y.

The first silicon layer 105 may comprise an amorphous silicon layer or a polysilicon layer. The first silicon layer 105 may comprise an undoped layer, a doped layer including impurities, or may have a stacked structure of an undoped layer and a doped layer.

Figure 2B:
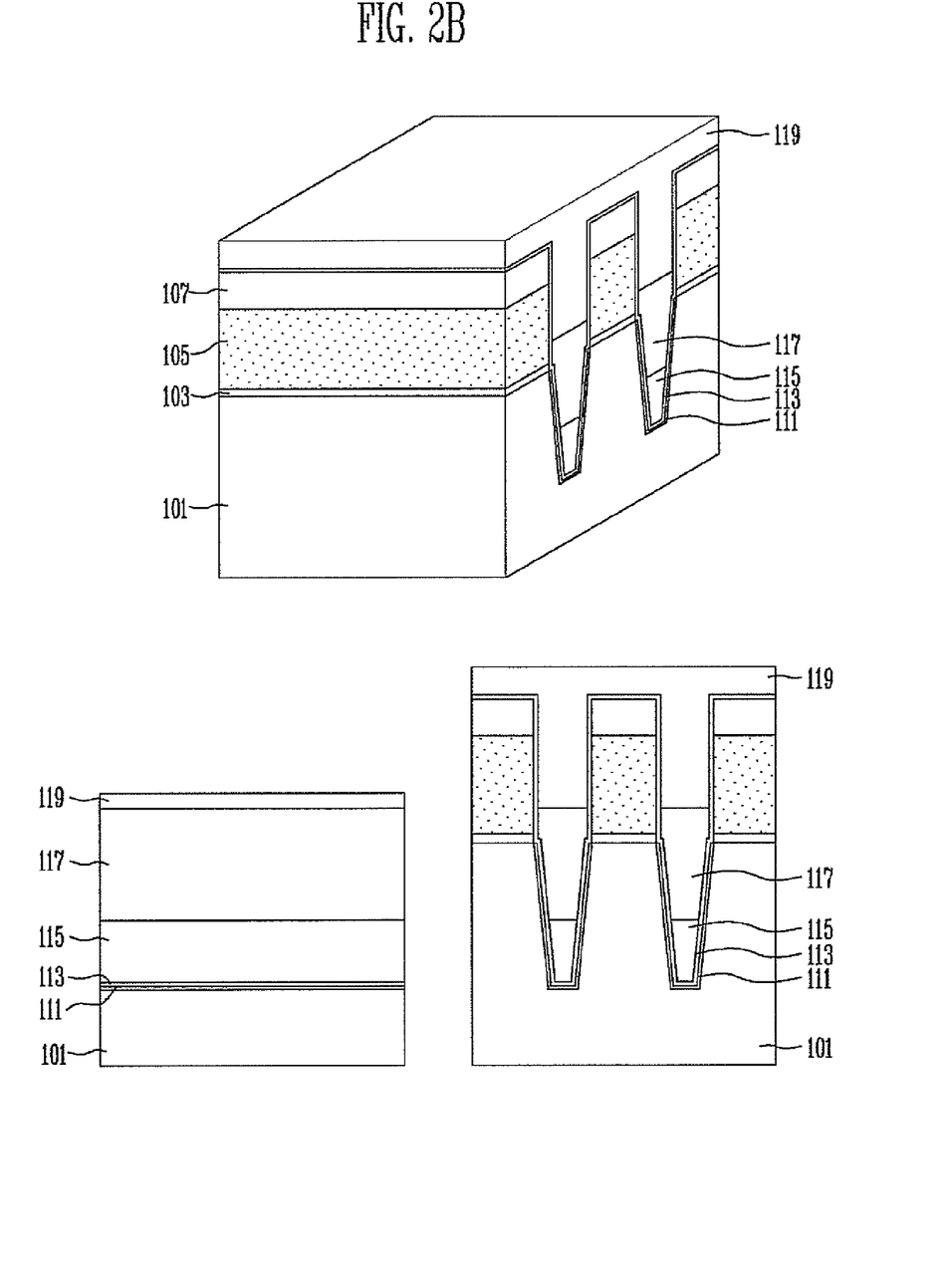

Referring to FIG. 2B, the wall oxide layer 111 may be formed along a sidewall and a bottom surface of each of the trenches 109. The wall oxide layer 111 may be formed by an oxidation process, and portions of the sidewall and the bottom surface of the trench 109 that may be damaged during an etch process may become the wall oxide layer 111. Subsequently, the sealing insulating layer 113 may be formed over the wall oxide layer 111, the tunnel insulating layer 103, first silicon layer 105 and the hard mask layer 107. The sealing insulating layer 113 may comprise a High Temperature Oxide (HTO) layer and may be formed by using a deposition process. The sealing insulating layer 113 may serve to prevent damage to a sidewall of the first silicon layer 105 in subsequent processes (e.g., an etch process).

Subsequently, a process of forming the isolation layers in the trenches 109 may be performed. First, the lower insulating layer 115 may be formed in a lower portion of each of the trenches 109. The lower insulating layer 115 may be formed to protect the lower portion of the trench 109 and control a vertical position of an air gap to be formed in the trench 109.

The lower insulating layer 115 may comprise a flowable insulating layer such as an SOG layer or a PSZ layer. In an exemplary embodiment, the semiconductor substrate 101 may be coated with an SOG layer. Since the SOG layer has flowablility, the SOG layer may fill the lower portion of the trench 109 even when the trench 109 is narrow and deep. Subsequently, heat treatment may be carried out to cure and density the SOG layer. Subsequently, an etch process may be performed to etch the SOG layer so that the SOG layer may remain only in the lower portion of the trench 109. In an alternative exemplary embodiment, the lower insulating layer 115 may be omitted.

Subsequently, the isolation insulating layer 117 and the capping insulating layer 119 may be formed over the lower insulating layer 115 in the trench 109. The isolation insulating layer 117 and the capping insulating layer 119 may be formed of different materials. For example, the capping insulating layer 119 may be formed of substantially the same material and in substantially the same manner as the lower insulating layer 115. In addition, the isolation insulating layer 117 may comprise a nitride layer, an undoped polysilicon layer, a doped polysilicon layer, a tungsten layer, or a TiN layer. Here, the nitride layer may be formed by atomic layer deposition, chemical vapor deposition or physical vapor deposition at temperatures ranging from room temperature to 800° C. The undoped polysilicon layer or the doped polysilicon layer may be formed at a temperature ranging from 400° C. to 600° C. The doped polysilicon layer may include boron, phosphorus, carbon, or nitrogen. The tungsten layer may be formed by chemical vapor deposition or physical vapor deposition at a temperature ranging from 100° C. to 500° C. The TiN layer may be formed by chemical vapor deposition at a temperature ranging from 300° C. to 700° C.

In addition, after the isolation insulating layer 117 is formed, the capping insulating layer 119, which will be described in detail with reference to a specific embodiment, may be formed on a top portion of the isolation insulating layer 117.

In an exemplary embodiment, a flowable insulating layer such as an SOG layer or a PSZ layer may be formed over the structure to fill the trenches 109 and at least spaces between first silicon layers 105. When the SOG layer is used as the flowable insulating layer, the SOG layer may be formed at a temperature ranging from room temperature to 100° C.

Subsequently, a heat treatment process may be performed on the SOG layer. The heat treatment process may include a curing process for solidifying the SOG layer and an annealing process for discharging impurities included in the SOG layer and densifying the SOG layer. The curing process may be performed at a temperature ranging from room temperature to 600° C. The annealing process may be performed by furnace annealing or rapid thermal annealing using a wet atmosphere, a $N_2$ atmosphere, an $O_2$ atmosphere, a NO atmosphere, or an $N_2O$ atmosphere, at a temperature ranging from 100° C. to 1100° C. In an exemplary embodiment, the heat treatment process may be performed such that an upper portion of the SOG layer, that is, a portion of the SOG layer that is above the middle of the height of the first silicon layer 105, may be cured. The cured portion of the SOG layer may become the capping insulating layer 119, and a lower portion of the SOG layer that is not cured, or is not sufficiently cured, may become the isolation insulating layers 117.

Figure 2C:
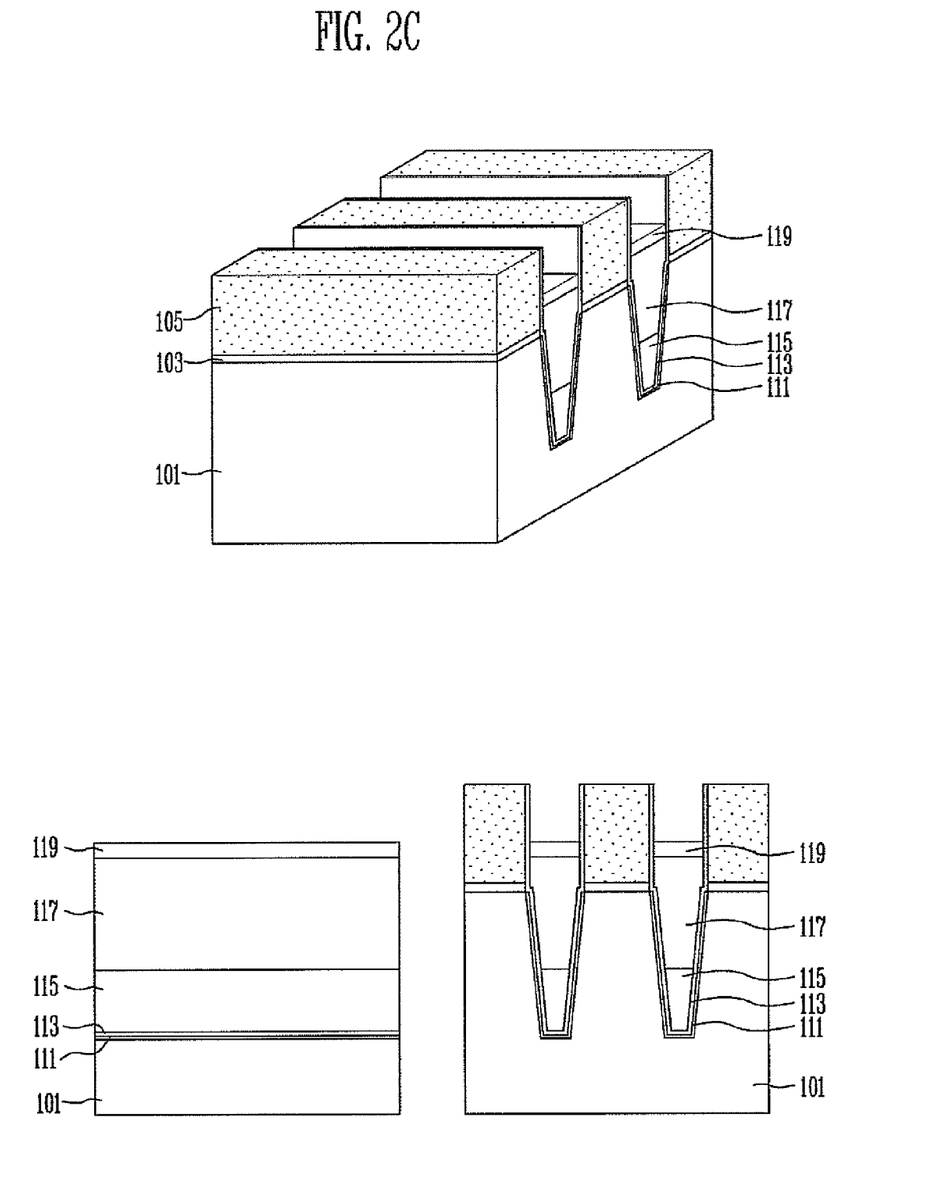

Referring to FIG. 2C, an upper portion of the capping insulating layer 119 may be etched so that the capping insulating layer 119 is located between the first silicon layers 105 at approximately a middle position of each of the first silicon layers (105). Here, the capping insulating layer 119 that remains on the isolation insulating layer 117 may serve as a protective layer that protects a bottom portion of a gate line (or a dielectric layer) that is formed in subsequent processes.

After the capping insulating layer 119 is removed, a protective layer may be formed over the isolation insulating layer 117 or a protective layer may be formed over the remaining capping insulating layer 119.

In this manner, the isolation layers may be formed. The lower insulating layer 115, the isolation insulating layer 117 and the capping insulating layer 119 all may become isolation layers. If the lower insulating layer 115 is omitted, then the isolation insulating layer 117 and the capping insulating layer 119 may be used as isolation layers. If the capping insulating layer 119 is omitted, then the lower insulating layer 115 and the isolation insulating layer 117 may be used as isolation layers. If both the lower insulating layer 115 and the capping insulating layer 119 are omitted, then an isolation layer may comprise only the isolation insulating layer 117.

A description has been made in reference to a case in which the aforementioned processes of forming isolation layers are performed in the cell region. However, the present invention is not limited thereto. These processes may be simultaneously performed in the cell region and the peripheral region where peripheral circuits are formed. In other words, substantially the same isolation layers may also be formed in the peripheral region.

Figure 2D:
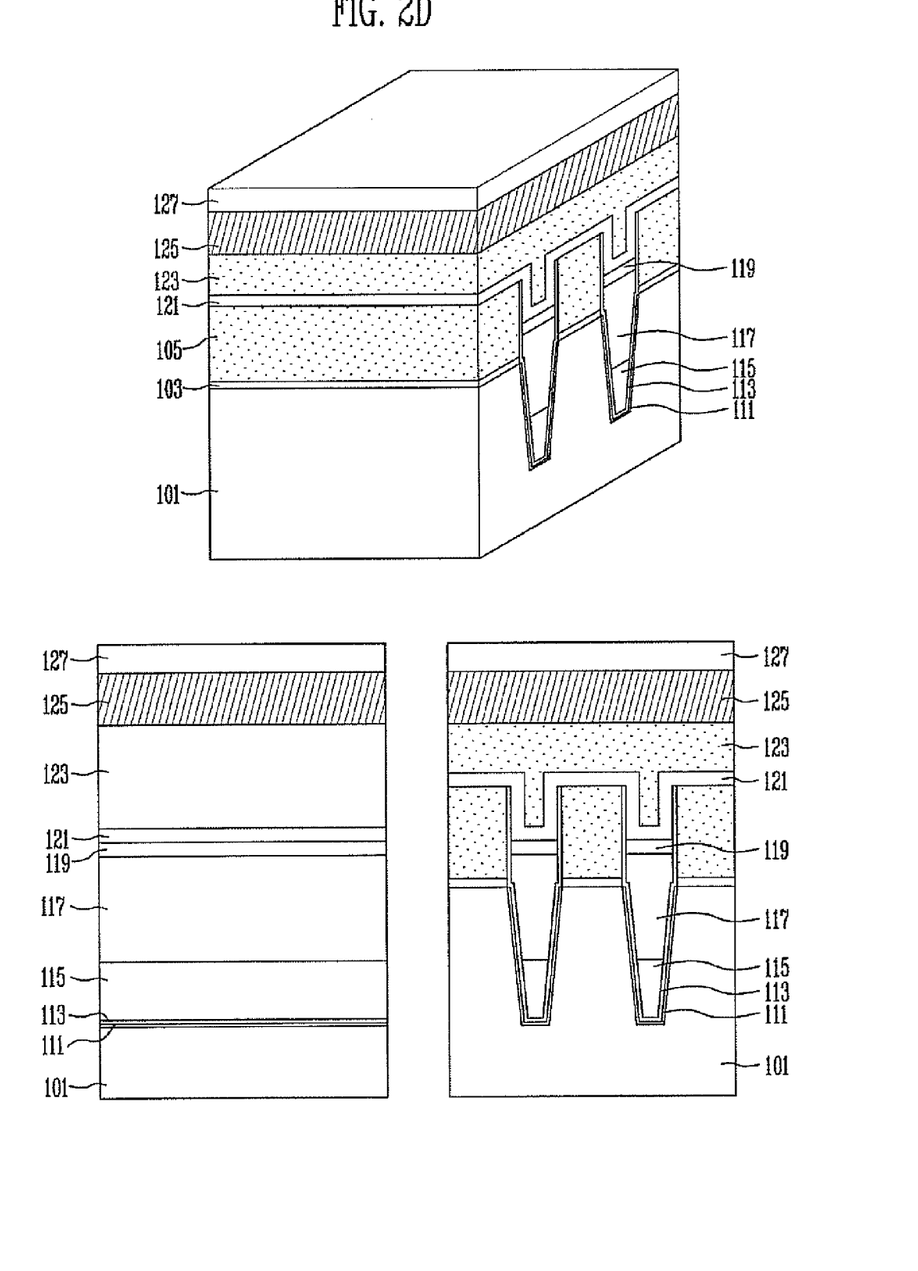

Referring to FIG. 2D, the dielectric layer 121, the second silicon layer 123, the metallic conductive layer 125 and the hard mask 127 may be formed over the structure shown in FIG. 2C. In an exemplary embodiment, the dielectric layer 121 may be formed over the first silicon layers 105 and the capping insulating layers 119.

The dielectric layer 121 may comprise an oxide layer, a nitride layer and an oxide layer that are stacked. The second silicon layer 123 and the metallic conductive layer 125 may form a control gate. The second silicon layer 123 may comprise a doped polysilicon layer, and the metallic conductive layer 125 may be formed of a tungsten layer, a cobalt layer, an aluminum layer, a copper layer, or a metal silicide layer.

Figure 2E:
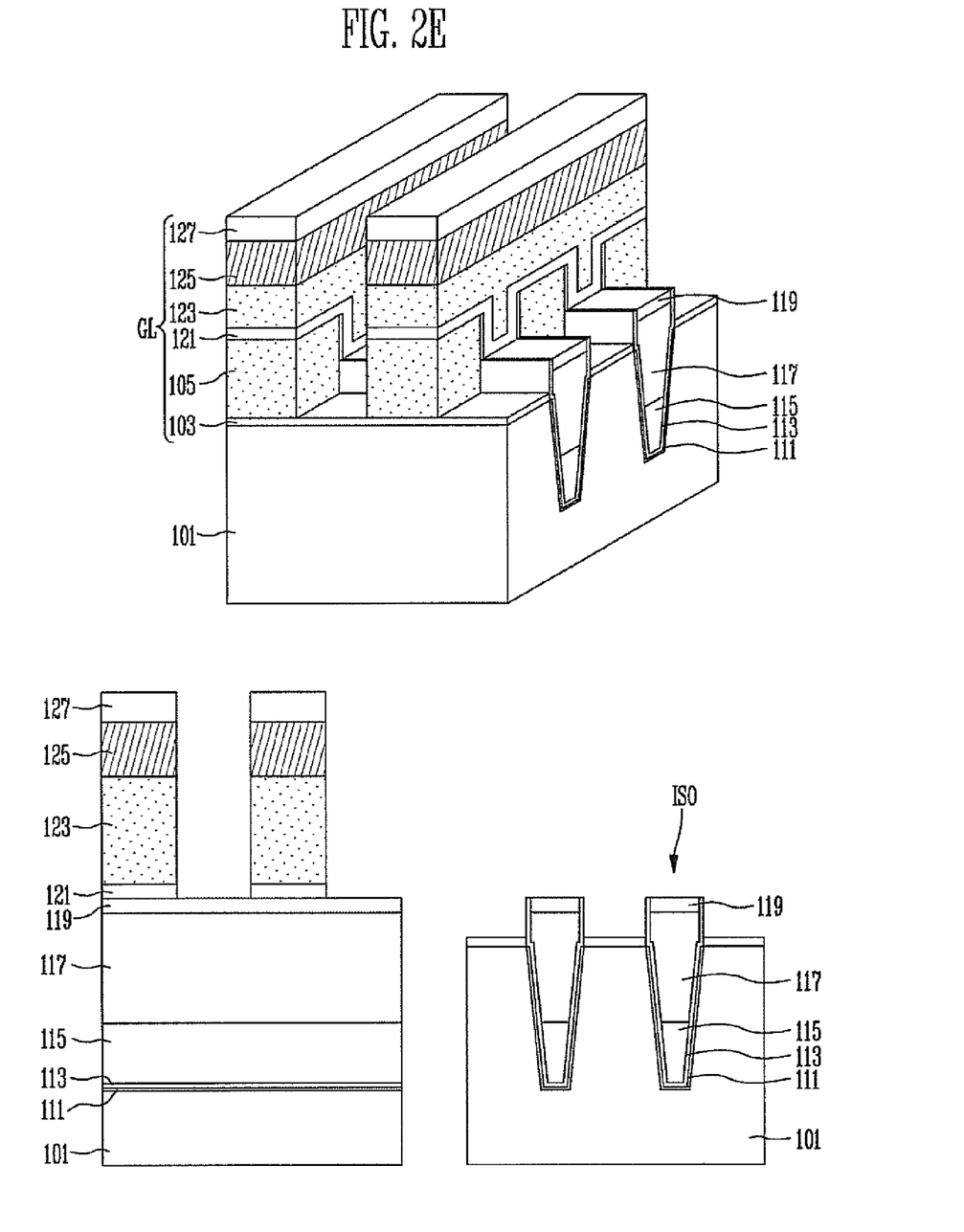

Referring to FIG. 2E, the hard mask 127, the metallic conductive layer 125, the second silicon layer 123 and the dielectric layer 121 may be etched so that the second silicon layer 123 and the dielectric layer 121 are in the form of lines along the second direction X, thus forming the control gate or a word line. Subsequently, exposed portions of the first silicon layers 105 may be removed by an etch process. The first silicon layers 105 may remain under a bottom portion of the control gate and become floating gates. Therefore, the gate lines GL, each of which has the tunnel insulating layer 103, the first silicon layers 105, the dielectric layer 121 and the control gate (123 and 125) that are stacked, may be formed in the second direction X crossing the isolation regions (or isolation layers).

Isolation layers ISO that are formed in the isolation regions may have top portions that extend higher than a surface of the semiconductor substrate 101 between the gate lines GL.

Figure 2F:
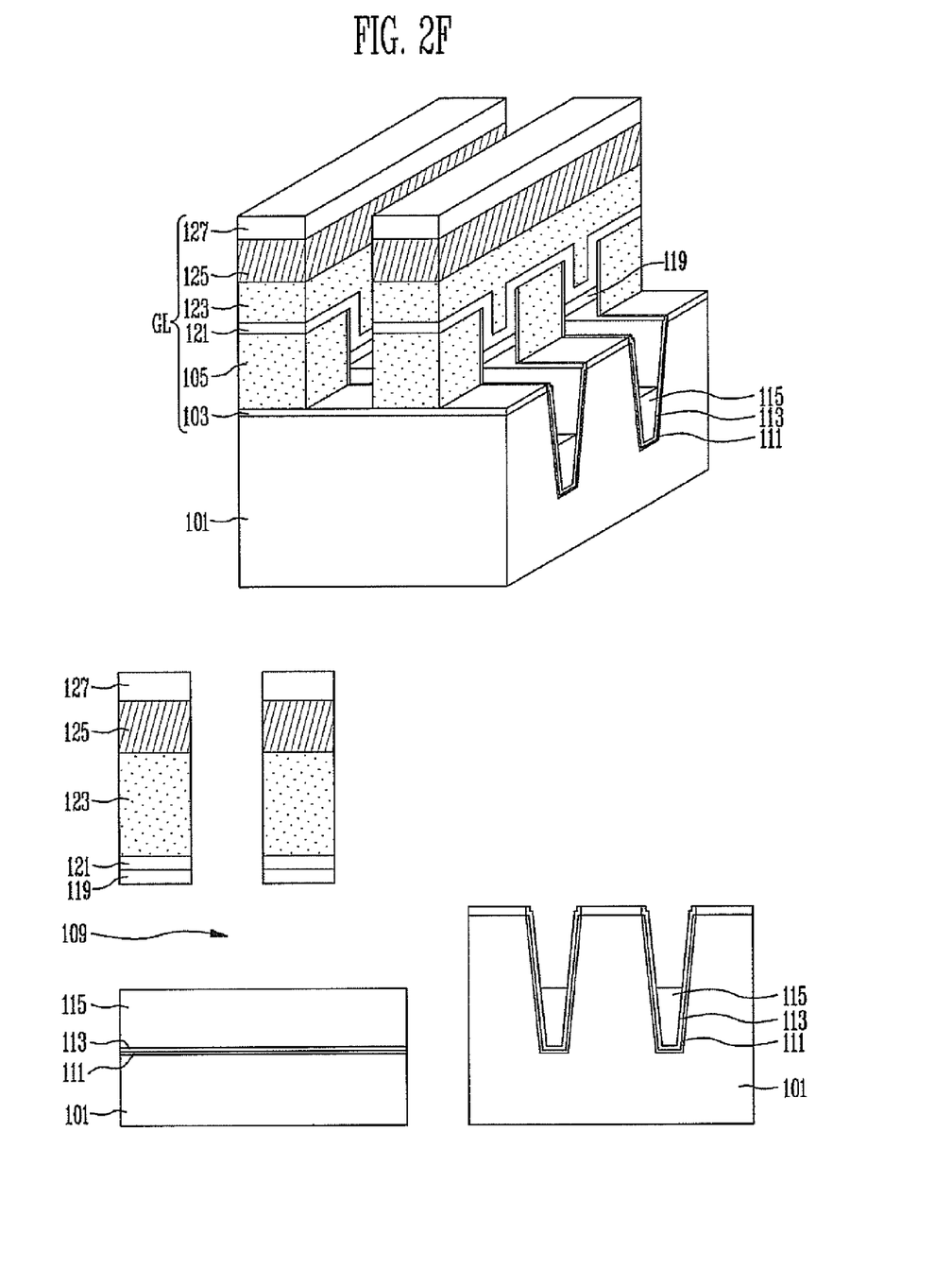
Figure 2G:
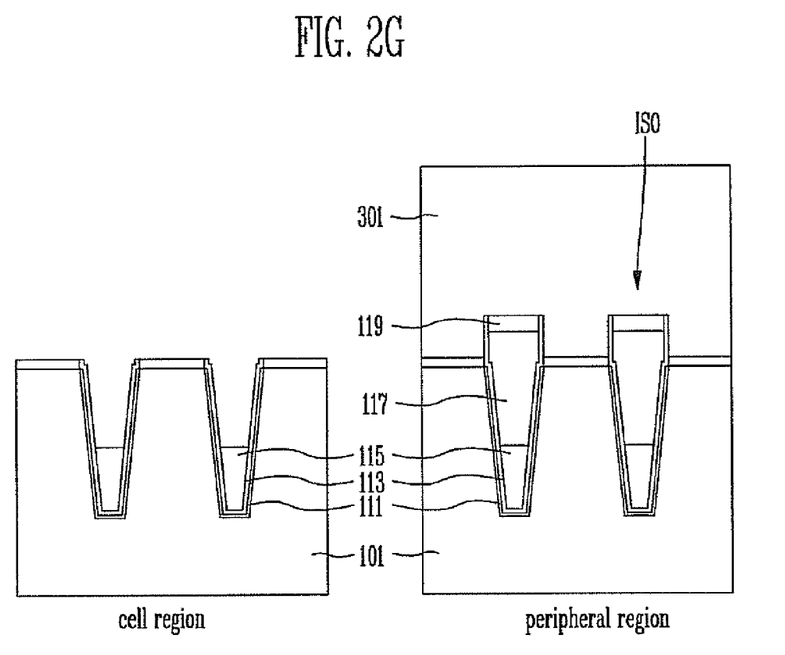

Referring to FIGS. 2F to 2G, an etch process may be performed to remove the isolation layers. In a peripheral region, a mask 301 may be formed so that the etch process will not remove the isolation layers. Therefore, after the etch process has been performed, the isolation layers ISO will remain in the peripheral region.

When the isolation layers are etched, the capping insulating layers 119 may be removed from between the gate lines GL and may remain under the bottom surfaces of the gate lines GL. In other words, the capping insulating layers 119 may remain to protect bottom portions of gate lines GL or bottom portions of the dielectric layers 121 during an etch process of removing the isolation insulating layers 117. The capping insulating layer 119 may be removed by anisotropic dry etching, such as an etch-back process, so that the capping insulating layers 119 may remain under the bottom surfaces of the gate lines GL.

Subsequently, as a part of the etch process of removing the isolation layers, an etch process may be performed to remove the isolation insulating layers 117. The etch process of the isolation insulating layer 117 may be performed by dry cleaning, wet cleaning, or plasma etching. Dry cleaning may be performed at a temperature ranging from room temperature to 200° C. by using $NH_3$, HF, IPA, $H_2$, $NF_3$, or a mixed gas thereof, according to the type of the isolation insulating layer 117. Wet cleaning may be performed at a temperature ranging from room temperature to 200° C. by using $H_2SO_4$, $H_2O_2$, HF, $NH_4OH$, HCl, $NH_4F$, $H_3PO_4$, $HNO_3$ or a mixture thereof, according to the type of the isolation insulating layer 117.

As described above, during the processes of forming or etching insulating layers (115, 117 and 119), the sidewall of the first silicon layer 105 and the sidewall and the bottom surface of the trench 109 may be protected by the sealing insulating layer 113.

The lower insulating layer 115 may be removed or may remain to control the position of the air gap AG. The lower insulating layer 115 may be removed using substantially the same processes as those performed to remove the capping insulating layer 119.

Through the aforementioned processes, all or a portion of each of the isolation layers may be removed.

Figure 2H:
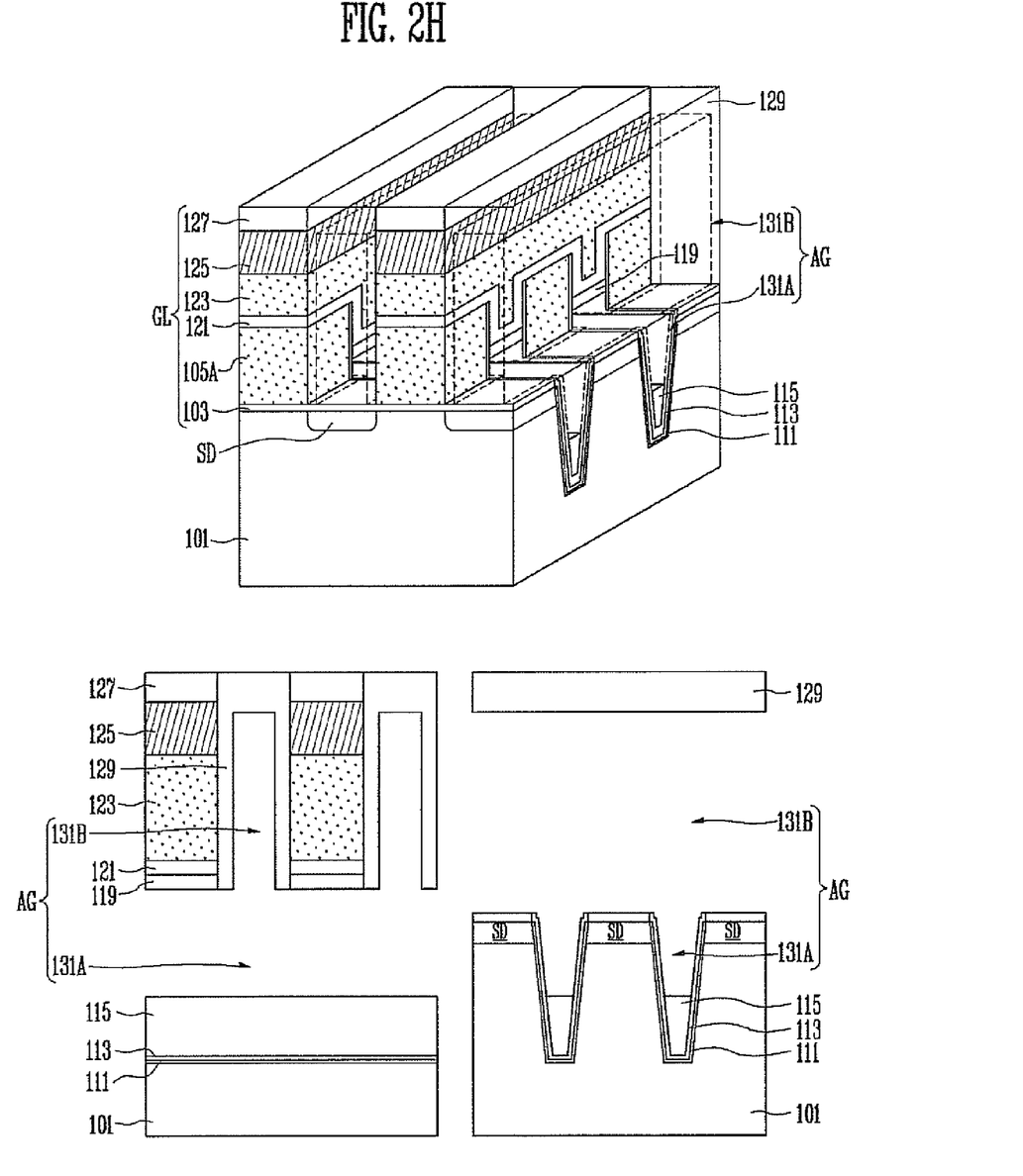

Referring to FIG. 2H, the source/drains SD may be formed in the active regions of the semiconductor substrate 101 between the gate lines GL. Subsequently, after the insulating layer 129 is formed between the gate lines GL, a planarization process may be performed. In this manner, the insulating layer 129 may remain only between the gate lines GL.

In order to form the air gap AG between the gate lines GL and within the trench 109, the insulating layer 129 may be formed of a material having poor step coverage (e.g., PE-USG layer) such that the insulating layer 129 may be formed to a minimum thickness between the gate lines GL and within the trench 109 and the insulating layer 129 may mostly remain at upper sidewalls of the gate lines GL.

In this manner, the air gap AG may extend in the first direction Y in the trenches 109 and extend in the second direction X in the insulating layer 129. More specifically, the air gap AG may include the first air gaps 131A and the second air gaps 131B. The first air gaps 131A may extend in the bit line direction or the first direction Y in the trenches 109. The second air gaps 131B may extend in the gate line direction, a word line direction or the second direction X in the insulating layer 129 between the gate lines GL. Top portions of the first air gaps 131A and bottom portions of the second air gap 131B may be coupled to each other. In particular, portions of the first air gap 131A may also be formed between the floating gates (105A) included in the same gate line GL.

By forming the air gap AG in the aforementioned manner, interference may be suppressed to thus improve electrical characteristics and reliability of a device.

Figure 3:
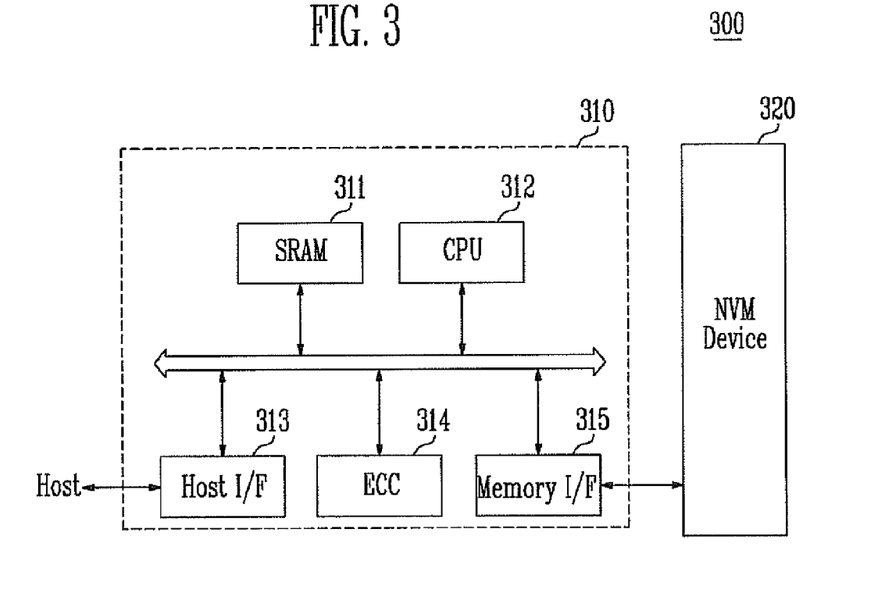
FIG. 3 is a schematic block diagram of a memory system according to an embodiment of the present invention.

FIG. 3 is a schematic block diagram of a memory system according to an embodiment of the present invention.

Referring to FIG. 3, a memory system 300 according to an embodiment of the present invention may include a non-volatile memory device 320 and a memory controller 310.

The non-volatile memory device 320 may include the cell region and the peripheral region that have the above-described structures. The memory controller 310 may be configured to control the non-volatile memory device 320. The memory system 300 may be a solid state disk (SSD) or a memory card in which the memory device 320 and the memory controller 310 are combined. The SRAM 311 is used as an operation memory of a processing unit 312. A host interface 313 may include a data exchange protocol of a host coupled to the memory system 300. In addition, an error correcting code (ECC) memory 314 may detect and correct errors included in data read from the non-volatile memory device 320. A memory interface 315 may perform to interface with the non-volatile memory device 320. The processing unit 312 may perform the general control operation for data exchange of the memory controller 310.

Though not shown in FIG. 3, the memory controller 310 may further include ROM that stores code data to interface with the host. The non-volatile memory device 320 may be a multi-chip package composed of a plurality of flash memory chips. The non-volatile memory device 320 may be provided as a storage medium having improved operating characteristics and high reliability. In particular, a memory system such as a Solid State Disk (SSD), on which research has been actively carried out, may include a flash memory device according to an embodiment of the present invention. In this case, the memory controller 310 may be configured to communicate with the outside (e.g., a host) through one of the interface protocols including USB, MMC, PCI-E, SATA, PATA, SCSI, ESDI, and IDE.

Figure 4:
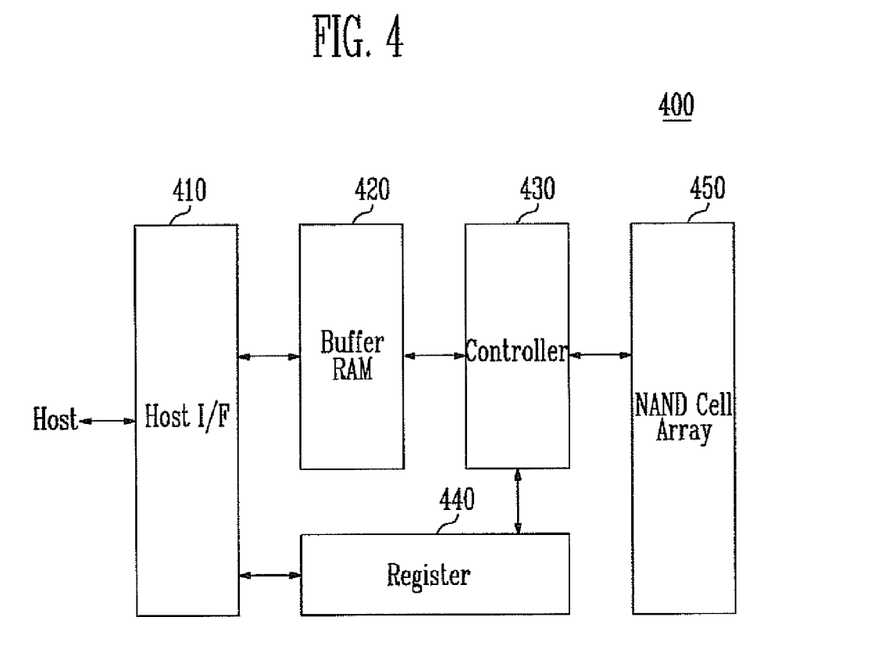
FIG. 4 is a schematic block diagram of a fusion memory device or a fusion memory system configured to perform a program operation according to the aforementioned various embodiments.

FIG. 4 is a schematic block diagram of a fusion memory device or a fusion memory system configured to perform a program operation according to the aforementioned various embodiments. For example, the technical features of the present invention may be used in an OneNAND flash memory device 400 as a fusion memory device.

The OneNAND flash memory device 400 may include may include a host interface (I/F) 410, a buffer RAM 420, a controller 430, a register 440 and a NAND flash cell array 450. The host interface 410 may be configured to exchange various types of information with a device through a different protocol. The buffer RAM 420 may have built-in codes for driving the memory device or temporarily store data. The controller 430 may be configured to control read and program operations and every state in response to a control signal and a command that are externally given. The register 440 may be configured to store data including instructions, addresses and configurations defining a system operating environment in the memory device. The NAND flash cell array 450 may be formed of operation circuits including page buffers and non-volatile memory cells having the structure described in connection with FIG. 1. In response to a write request from a host, the OneNAND flash memory device 400 programs data in the aforementioned manner.

Figure 5:
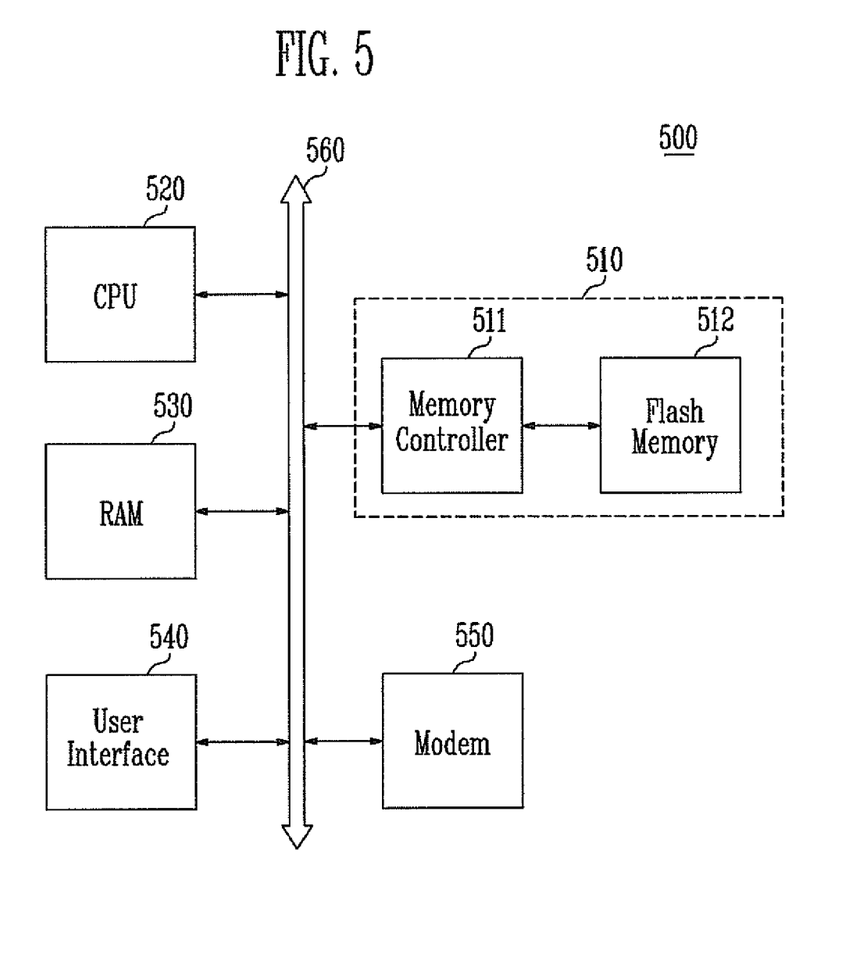
FIG. 5 is a schematic block diagram of a computing system including a flash memory device according to an embodiment of the present invention.

FIG. 5 is a schematic view of a computing system including a flash memory device 512 according to an embodiment of the present invention.

A computing system 500 according to an embodiment of the present invention may include a microprocessor (CPU) 520, RAM 530, a user interface 540, a modem 550, such as a baseband chipset, and a memory system 510 that are electrically coupled to a system bus 560. In addition, if the computing system 500 is a mobile device, then a battery may be provided to apply operating voltage to the computing system 500. Though not shown in FIG. 5, the computing system 500 may further include application chipsets, a Camera Image Processor (CIS), or mobile DRAM. The memory system 510 may form a Solid State Drive/Disk (SSD) that uses the non-volatile memory described in connection with FIG. 1 to store data. The memory system 510 may be provided as a fusion flash memory (e.g., OneNAND flash memory).

According to an embodiment of the present invention, electrical characteristics and reliability of a device may be improved.

What is claimed is:

1. A method of manufacturing a semiconductor device, the method comprising:
   forming, in a first direction, trenches in isolation regions of a semiconductor substrate;
   forming an SOG layer over the semiconductor substrate to fill the trenches;
   performing a heat treatment process to cure a top portion of the SOG layer to form a cured portion of the SOG layer;
   curing only the top portion of the SOG layer, at a temperature ranging from room temperature to 600° C., to form the cured portion of the SOG layer;
   performing, at a temperature ranging between 100° C. and 1100° C., furnace annealing or rapid thermal annealing on the SOG layer using a wet atmosphere, a $N_2$ atmosphere, an $O_2$ atmosphere, a NO atmosphere, or an $N_2O$;
   etching the SOG layer so that a top surface of the cured portion of the SOG layer is at substantially a middle height of each of the gate lines;
   forming gate lines, in a second direction crossing the first direction, over the isolation layers and over active regions defined between the isolation layers;
   forming first air gaps, extending in the first direction, by performing an etching process to remove at least a portion of each of the isolation layers; and
   forming an insulating layer between the gate lines so that an air gap is formed in the insulating layer,
   wherein the air gap extends in the first direction in the trenches and extends in the second direction between the gate lines.

2. The method of claim 1, where the SOG layer is formed at a temperature ranging from room temperature to 100° C.

3. The method of claim 1, where etching the SOG layer further comprises: etching the SOG layer so that the cured portion of the SOG layer is in proximity to a bottom portion of each of the gate lines.

4. The method of claim 1, where each of the isolation layers comprises one or more of a nitride layer, an undoped polysilicon layer, a doped polysilicon layer, a tungsten layer, or a titanium nitride (TiN) layer.

5. The method of claim 1, where forming the isolation layers further comprises: forming a lower insulating layer in a lower portion of each of the isolation layers.

6. The method of claim 1, further comprising: forming a capping insulating layer on a top portion of each of the isolation layers.

7. The method of claim 6, further comprising: removing, via an etching process, a portion of the capping insulating layer exposed between the gate lines, so that a portion of the capping insulating layer remains at a bottom portion of each of the gate lines.

8. The method of claim 1, where the etching process may be performed by dry cleaning, wet cleaning, or plasma etching.

9. The method of claim 1, further comprising:
- forming a tunnel insulating layer and a silicon layer over the active regions of the semiconductor substrate; and
- forming a dielectric layer and a control gate over the isolation layers; and where forming the gate lines further comprises:
- patterning the control gate, the dielectric layer and the silicon layer.

10. The method of claim 1, where each of the insulating layers comprises a PE-USG layer.

* * * * *